United States Patent
Gao et al.

(10) Patent No.: US 11,868,695 B1
(45) Date of Patent: Jan. 9, 2024

(54) DRIVER RESIZING USING A TRANSITION-BASED PIN CAPACITANCE INCREASE MARGIN

(71) Applicant: Cadence Design Systems, Inc., San Jose, CA (US)

(72) Inventors: Jhih-Rong Gao, Austin, TX (US); Yi-Xiao Ding, Austin, TX (US); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 285 days.

(21) Appl. No.: 17/219,730

(22) Filed: Mar. 31, 2021

(51) Int. Cl.
*G06F 30/337* (2020.01)
*G06F 16/22* (2019.01)

(52) U.S. Cl.
CPC .......... *G06F 30/337* (2020.01); *G06F 16/22* (2019.01)

(58) Field of Classification Search
CPC ............................ G06F 30/337; G06F 16/22
See application file for complete search history.

*Primary Examiner* — Jack Chiang
*Assistant Examiner* — Aric Lin
(74) *Attorney, Agent, or Firm* — Schwegman Lundberg & Woessner, P.A.

(57) ABSTRACT

Aspects of the present disclosure address systems and methods for driver resizing using a transition-based capacitance increase margin. An integrated circuit (IC) design stored in a database in memory is accessed. The IC design comprises a net comprising a set of driver cells. A capacitance increase margin for resizing an initial driver cell is determined based on a total capacitance of the net and transition time target associated with the initial driver cell. An alternative driver cell is selected from a library to resize the initial driver cell and is used to replace the initial driver cell in the net. The alternative driver is selected such that a pin capacitance of the alternative driver cell exceeds an initial pin capacitance corresponding to the initial driver cell by no more than the capacitance increase margin.

19 Claims, 6 Drawing Sheets

DRIVER RESIZING USING A TRANSITION-BASED PIN CAPACITANCE INCREASE MARGIN

TECHNICAL FIELD

The present disclosure generally relates to the technical field of integrated circuit design. In particular, the present disclosure addresses systems and methods for driver resizing using a transition-based pin capacitance increase margin.

BACKGROUND

An integrated circuit (IC) layout specifies portions of various components of an IC. An IC design can include one or more clock trees as well as one or more data path trees. A clock tree distributes a clock signal from its root (e.g., a clock source) to sinks (e.g., flip flops) within an IC through a branching network of drivers (e.g., buffers or inverters). Similarly, a data path tree distributes a data signal from its root (e.g., flip-flops or combination logic) to sinks (e.g., flip flops) within an IC through a branching network of drivers (e.g., buffers or inverters). In either case, a driver distributes a signal to a grouping of other drivers and/or sinks, referred to as a "fanout" of a driver. Connectivity between a driver and its fanout is represented by a "net" and will be physically implemented by routed wires.

Electronic design automation (EDA) software systems commonly perform driver resizing to improve transition time, delay, power and other design constraints during data path optimization processes performed on an IC design. Driving resizing involves switching a driver cell to another driver cell with identical functionality, but different physical characteristics.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As noted above, driver resizing is a common technique used to improve transition time, delay, power and other design constraints during data path optimization processes performed on IC design. As the number of drivers that are under optimization during driver resizing is usually large, multiple net drivers are typically processed in parallel to reduce the runtime. However, parallel computing may cause unexpected transition or timing degradation if multiple drivers under the same net are resized at the same time.

Aspects of the present disclosure address this problem, among others, with systems and methods for driver resizing using a transition-based pin capacitance margin computation. The pin capacitance margin restricts the capacitance of resized driver cell candidates in driver resizing processes. A pin capacitance margin computed for a driver ensures the driver is resized in a safe range and reduces upstream transition and timing degradation.

Consistent with some embodiments, a method may include accessing an integrated circuit design stored in a database in memory, the integrated circuit design comprising a net (e.g., a clock net or data path net) comprising a set of driver cells. The method further includes determining a capacitance increase margin for resizing an initial driver cell in the net based on a total capacitance of the net and transition time target of the driver cell. An alternative driver cell for replacing the driver cell in a resizing process is selected from a library based on the capacitance increase margin. The alternative driver is selected such that a pin capacitance of the alternative driver cell exceeds an initial pin capacitance corresponding to the initial driver cell by no more than the capacitance increase margin. The method further includes replacing the driver cell with the alternative driver cell in the net and storing an update to the integrated circuit design in the database in memory based on the alternative driver.

Figure 1:
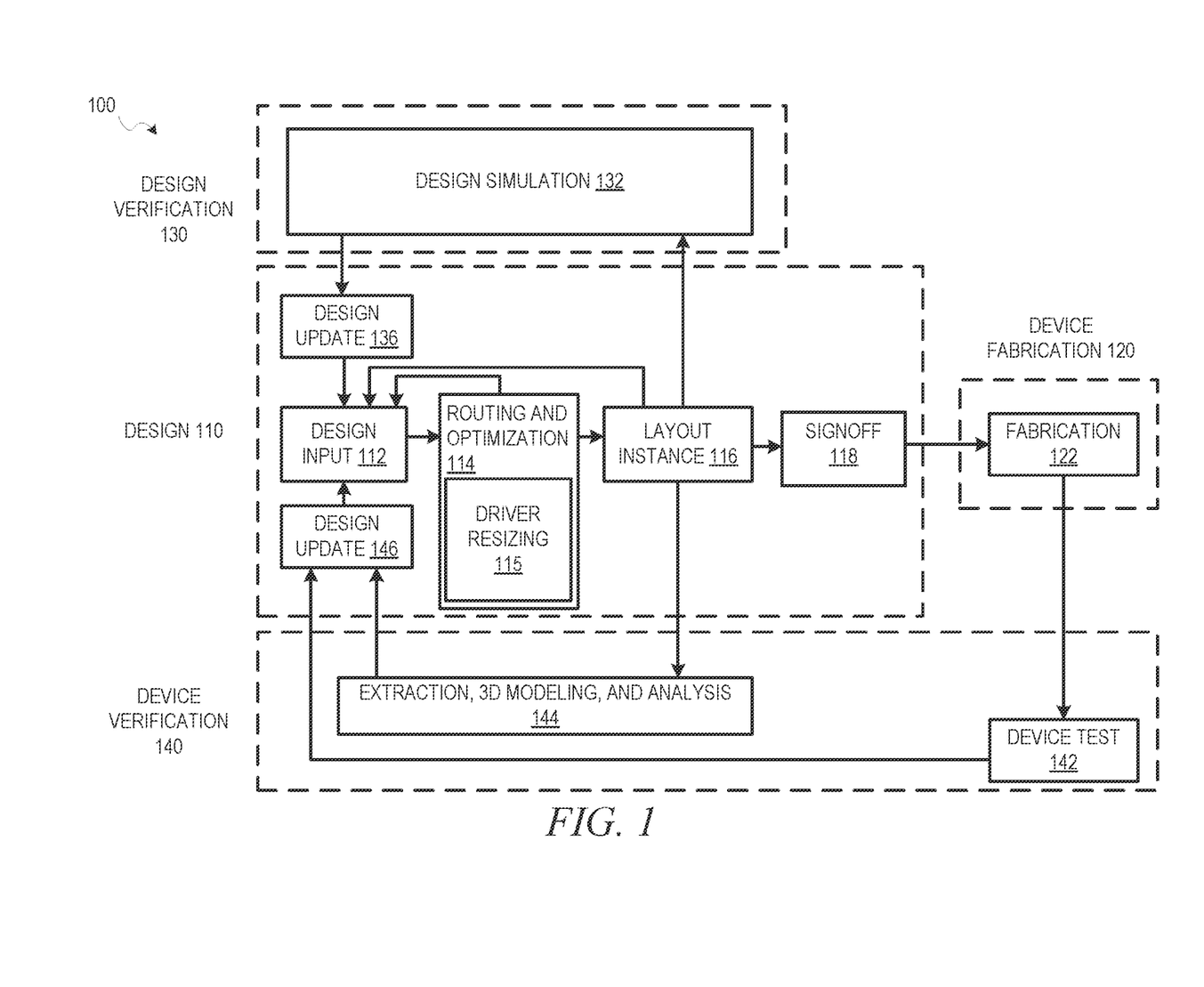
FIG. 1 is a diagram illustrating an example design process flow that includes a method for driver resizing using a capacitance increase margin, according to some embodiments.

FIG. 1 is a diagram illustrating an example design process flow 100 that includes a method for driver resizing using a capacitance increase margin, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design, and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. While the design process flow 100 shows the routing and optimization 114 operation occurring prior to a layout instance 116, routing, timing analysis, and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

As shown, the routing and optimization 114 operation includes a driver resizing 115 operation, which may be performed in accordance with various embodiments described herein. As will be discussed further below, during driver resizing 115 an initial net in the design (e.g., a clock net or a data path net) may be iteratively refined. A net of the IC design describes interconnections between a driver (also referred to herein as a "net driver") and sinks and/or drivers that are driven by the driver. Each driver delivers a signal (e.g., a clock signal or other data signal) to a set of sinks and/or a set of drivers.

As part of driver resizing 115, net drivers are evaluated for resizing based on a capacitance increase margin. Multiple processing threads are used to perform driver resizing on multiple nets in parallel. Each net may correspond to a portion of a clock tree or data path tree. Within each processing thread, a capacitance increase margin is calculated for a net driver. The capacitance increase margin can be used to determine a maximum pin capacitance for an alternative driver cell that is selected to replace an initial driver cell for the net driver. More specifically, an alternative driver cell is selected such that a pin capacitance of the alternative driver cell does not exceed the maximum pin capacitance. A particular net driver may be resized by replacing an initial driver cell used for the net driver with the alternative driver cell selected based on the capacitance increase margin.

After design inputs are used in the design input 112 operation to generate a circuit layout, and any of the routing and optimization 114 operations are performed, a layout is generated in the layout instance 116. The layout describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

A design update 136 from the design simulation 132 operations; a design update 146 from the device test 142 operations or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
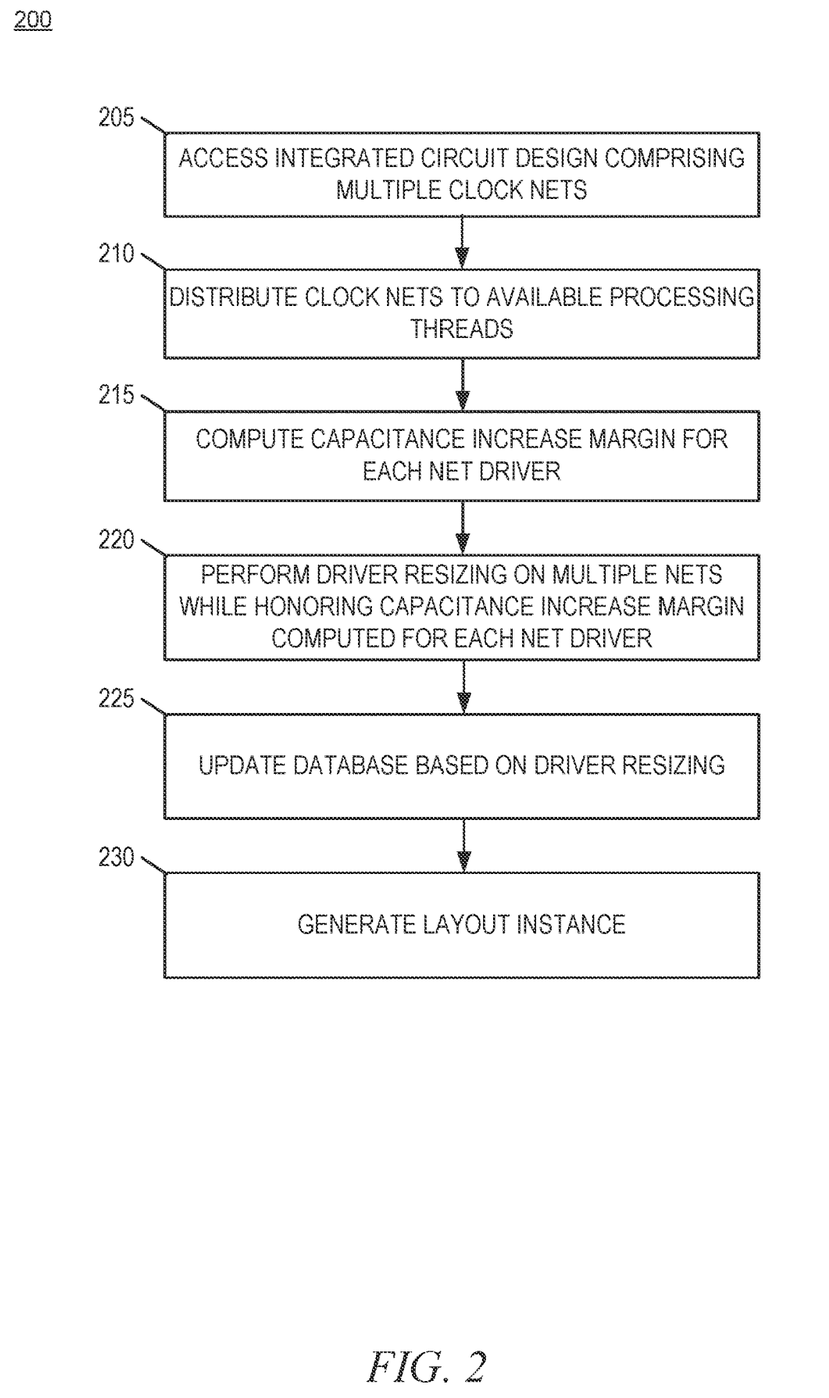
FIGS. 2-4 are flowcharts illustrating operations of a method for driver resizing using a transition-based pin capacitance increase margin, according to some example embodiments.
Figure 3:
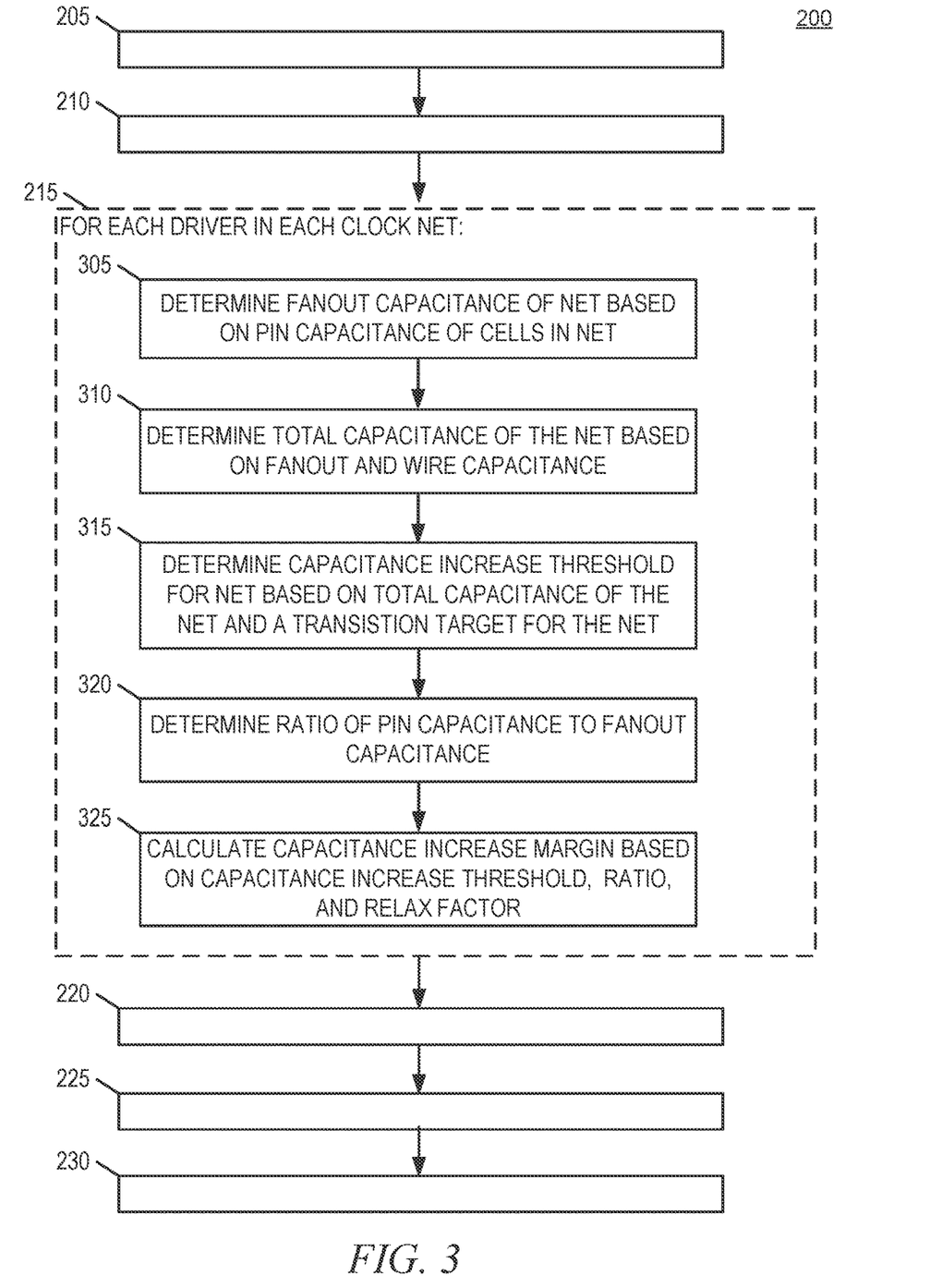
Figure 4:
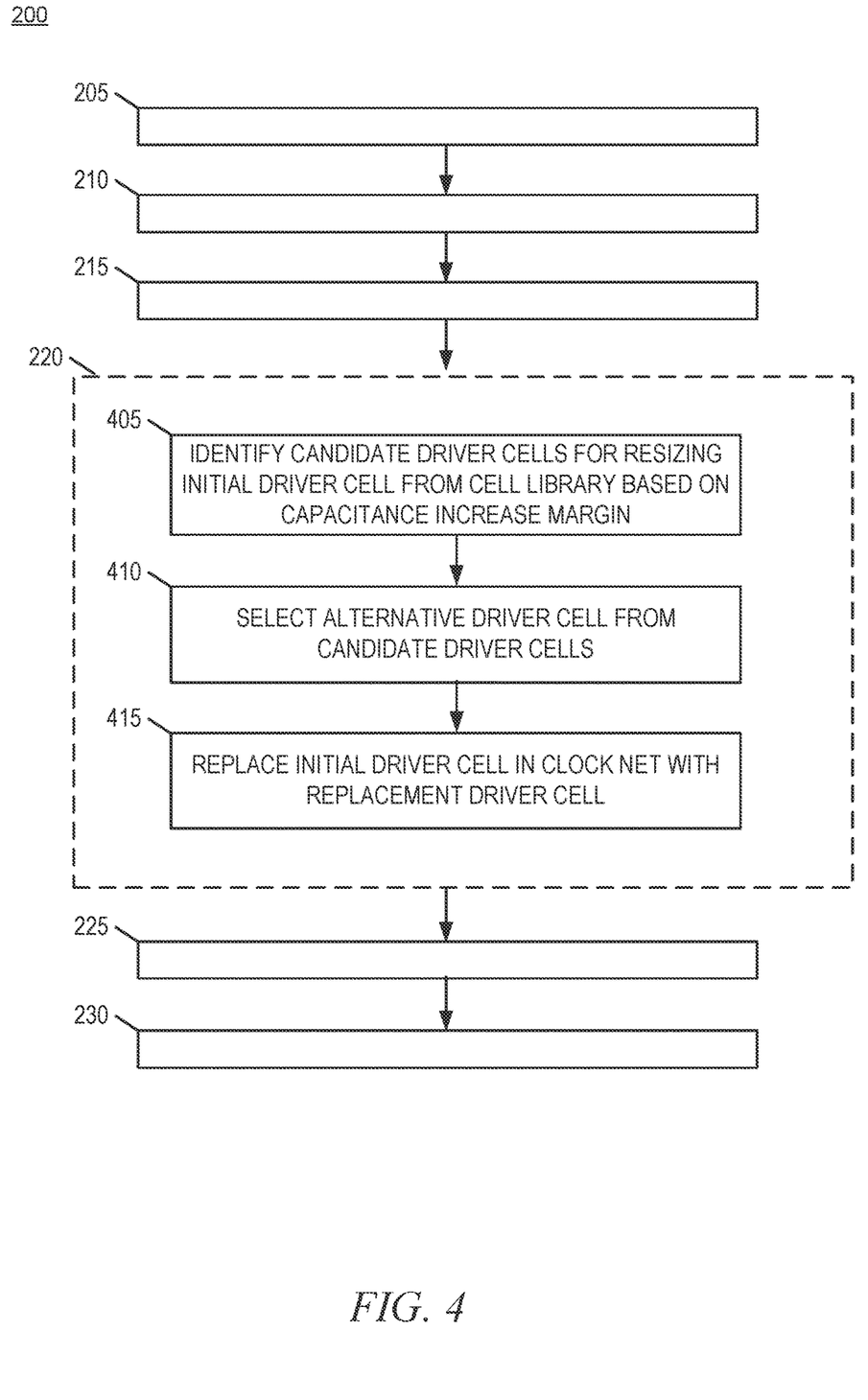

FIGS. 2-4 are flowcharts illustrating operations of a method 200 for driver resizing using a transition-based pin capacitance increase margin, according to some example embodiments. For some embodiments, the method 200 is performed as part of a CTS process applied to a circuit design (e.g., by an EDA software system).

It will be understood that the method 200 may be performed by a device, such as a computing device executing instructions of an EDA software system. For instance, the operations of the method 200 may be represented by executable instructions (e.g., EDA software) that, when executed by a processor of a computing device, cause the computing device to perform the method 200. Thus, any one or more operations of the method 200 may be performed by a hardware processor (e.g., central processing unit or graphics processing unit) of a computing device (e.g., desktop, server, etc.). Accordingly, the method 200 is described below with reference to such a computing device.

Depending on the embodiment, an operation of the method 200 may be repeated in different ways or involve intervening operations not shown. Though the operations of the method 200 may be depicted and described in a certain order, the order in which the operations are performed may vary among embodiments, including performing certain operations in parallel.

The method 200 as illustrated begins at operation 205 where the computing device accesses an integrated circuit design from a database stored in memory. The integrated circuit design comprises multiple nets (e.g., clock nets and data path nets). Each net comprises one or more routes that connect a root node to one or more drivers, each of which is connected to one or more downstream cells in its fanout. Each net can correspond to a portion of an initial clock tree or data path tree.

The computing device distributes the multiple nets among available parallel processing threads to perform driver resizing, at operation 210. That is, the computing device includes multiple processing threads that can execute to perform driver resizing on the multiple nets in parallel.

At operation 215, the computing device computes a capacitance increase margin for each driver cell in each net. The computing device can compute a capacitance increase margin for a given driver cell in a given net based on a total capacitance of the net and a transition time target of the driver cell. Further details regarding the computation of the capacitance increase margin are discussed below in reference to FIG. 4.

At operation 220, the computing device performs driver resizing on the multiple nets of the IC design while honoring the capacitance increase margin computed for each driver cell in the net. That is, the capacitance increase margin computed for a particular driver cell constrains selection of driver cell resizing candidates such that a pin capacitance of the selected resizing candidate does not exceed the original pin capacitance by more than the capacitance increase margin.

At operation 225, the computing device updates information the database based on the driver resizing. That is, the computing device stores an update to the IC design in the database in memory. The update may correspond to an updated clock tree or update data path.

At operation 230, the computing device generates a layout instance for the IC design based on the updated information in the database (e.g., based on the driver resizing). The layout instance describes the physical layout dimensions of the integrated circuit design. The layout instance can be based on an updated clock tree generated by resizing drivers of an initial clock tree.

As shown in FIG. 3, the method 200 may, in some embodiments, further include operations 305, 310, 315, 320, and 325. The operations 305, 310, 315, 320, and 325 can be performed as part of operation 215 (e.g., a sub-routine or sub-operations) where the computing device computes capacitance increase margins for driver cells in each net of the integrated circuit design. Although the description that follows focuses on a single driver cell of a single net, as shown, the 305, 310, 315, 320, and 325 can be repeated for each net in the design while operations 315, 320, and 325 can be performed for each driver cell in the net.

At operation 305, the computing device determines a fanout capacitance of a net based on a sum of pin capacitances of cells in the net. In an example, a net comprises three single input pin net drivers that correspond to pins A, B, and C, and the computing device can determine the fanout capacitance of the net as follows:

fanoutCap$_{Net}$=pinCapA+pinCapB+pinCapC here pinCap$_A$ is the pin capacitance of pinA.pinCap$_B$ is the pin capacitance of pin B, and pinCap$_C$ is the pin capacitance of pin C.

At operation 310, the computing device determines a total capacitance of the net based on a sum of the determined fanout capacitance and a wire capacitance of the net. The computing device can determine the wire capacitance of the net based on a total wirelength in the net. In an example, the computing device determines the total capacitance as follows:

totalCap$_{Net}$=fanoutCap$_{Net}$+wireCap$_{Net}$

At operation 315, the computing device determines a capacitance increase threshold for a driver cell in the net based on the total capacitance of the net, a computed transition time associated with the driver cell, and a target transition time of the driver cell. In an example, the computing device can determine a capacitance increase threshold for net driver cell in the net as follows:

$$\text{Cap Increase Threshold} = totalCap_{Net} \times \left(1 - \frac{tran}{tranTarget}\right)$$

where tran is the transition time associated with the net driver cell and IranTarget is the target transition time for the driver cell.

At operation 320, the computing device determines a ratio of pin capacitance to fanout capacitance for the driver cell in the net. In an example, the computing device determines the following ratio:

$$\text{ratio} = \frac{pinCap}{fanoutCap}$$

where pinCap is the pin capacitance of the driver cell and fancutCap is the fanout capacitance of the driver cell.

At operation 325, the computing device calculates a capacitance increase margin for the driver cell based on the capacitance increase margin for the net, the ratio, and a relax factor. The relax factor is a configurable In an example, the computing device calculates the capacitance increase margin for the driver cell as follows:

$$\text{Margin} = totalCap_{Net} \times \left(1 - \frac{tran}{tranTarget}\right) \times \frac{pinCap}{fanoutCap} \times RelaxFactor$$

As shown in FIG. 4, the method 200 may, in some embodiments, further include operations 405, 410, and 415. Consistent with these embodiments, the operations 405, 410, and 415 may be performed as part of (e.g., a sub-routine or sub-operations) of operation 220 and can be repeated for any one or more driver cells in the integrated circuit design.

At operation 405, the computing device identifies a set of candidate driver cells for resizing an initial driver cell in a net based on the capacitance increase margin computed for the initial driver cell (e.g., at operation 325). Each of the candidate driver cells that are selected are a different size than the initial driver cell. The computing device identifies the set of candidate driver cells from a cell library. The cell library or portions thereof can be stored in local memory or can be accessed from networked storage device.

The computing device identifies candidate driver cells that have an associated pin capacitance that exceeds an initial pin capacitance of the initial driver cell by no more than the capacitance increase margin. That is, the computing device identifies driver cells within pin capacitances that equal to or less than a capacitance threshold established by a sum of the initial pin capacitance and the capacitance increase margin (Cap$_{Max}$=pinCap$_{initial}$+Margin).

At operation 410, the computing device selects an alternative driver cell from the set of candidate driver cells to resize the initial driver cell in the net based on the capacitance increase margin computed for the initial driver cell (e.g., at operation 325). The initial driver cell is a first size and the alternative driver cell is a second size.

In selecting the alternative driver cell to replace the initial driver cell, the computing device can rank the set of candidate driver cells and select a driver cell from the set based on the ranking. The computing device can rank candidate cells by pin capacitance, size, or other characteristic. In some embodiments, the computing device selects the driver cell from the set of candidate driver cells with the highest pin capacity.

The computing device replaces the initial driver cell in the net with the alternative driver cell, at operation 415. In doing so, the computing device resizes the driver cell. In some instances, the second size is greater than the first size, and in these instances, the computing device upsizes the driver cell. In some instances, the second size is less than the first size, and in these instances, the computing device downsizes the driver cell.

In some embodiments, prior to resizing the clock-tree instance according to the alternative size, the computing device may verify that the resizing of the clock-tree instance does not violate any design constraints such as skew, slew, and capacitance. If resizing the clock-tree instance would result in violation of any one of the design constraints, the computing device may maintain the clock-tree instance at its initial size or resize according to another alternative size that does not result in violation of a design constraint.

Figure 5A:
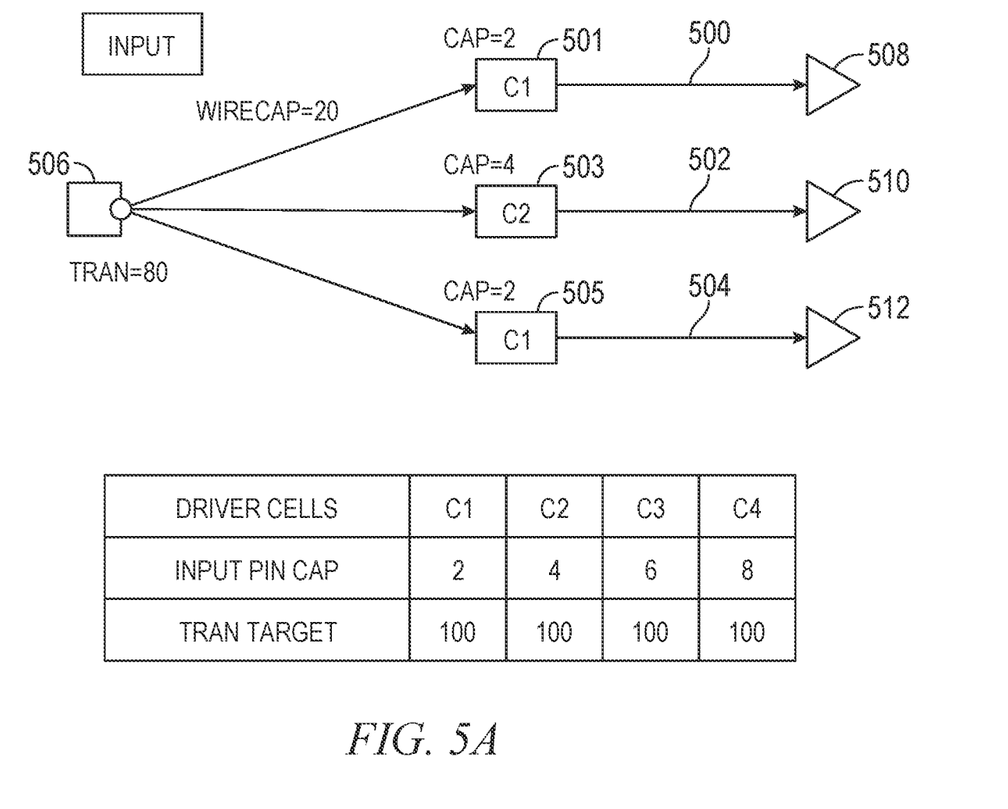
FIGS. 5A and 5B are conceptual diagrams that graphically illustrate a method for driver resizing using a transition-based pin capacitance increase margin, according to some embodiments.
Figure 5B:
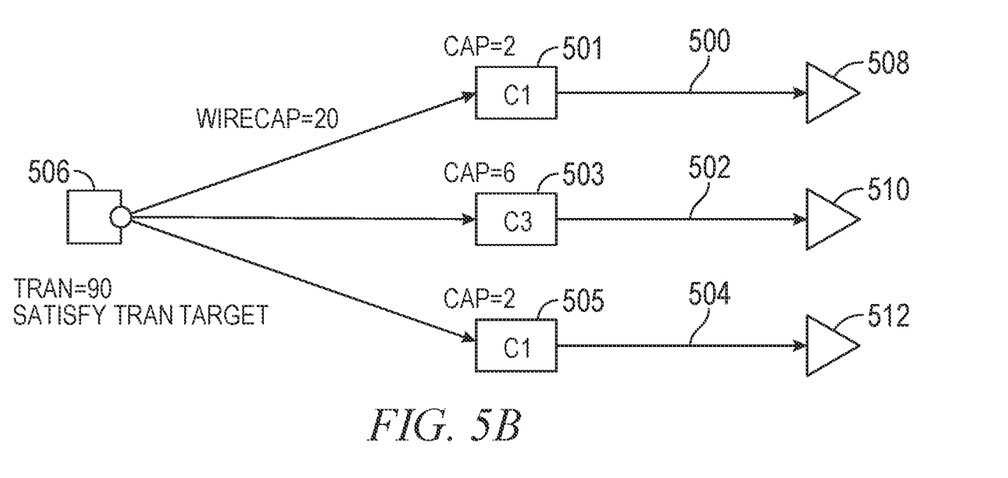

FIGS. 5A and 5B are conceptual diagrams that graphically illustrate the method 200 for driver resizing using a transition-based pin capacitance increase margin, according to an example.

With reference to FIG. 5A, nets 500, 502, and 504 are shown. Net driver 501 drives net 500, net driver 503 drives net 502, and net driver 505 drives net 504. Each of the net drivers 501, 503, and 505 are connected to a root node 506. The net drivers 501, 503, and 505 respectively deliver a clock signal from the root node 506 (e.g., a clock source or a driver) to fanout 508, 510, and 512. The fanout connected to each of the net drivers 501, 503, and 505 can comprise net driver and/or clock sinks.

In performing the method 200, the computer device evaluates each of the net drivers 501, 503, and 505 for possible resizing. As noted above, the computing device performs net driver resizing in parallel processing threads and as such, the computing device can evaluate and resize the net drivers 501, 503, and 505 in parallel. The computing device can evaluate down-stream nodes in the fanout 508, 510, and 512 in a top-down search of the net 500, 502, and 504.

A representation of a cell library 514 is also illustrated in FIG. 5A. The cell library 514 comprises cells c1, c2, c3, and c4. An input pin capacitance and target transition time are also provided for each cell in the library. The net driver 501 includes a first instance of cell c1, the net driver 503 includes an instance of cell c2, and the net driver 505 includes a second instance of cell c1. Hence, net drivers 501 and 505 have an initial pin capacitance (referred to below as "pin-Cap$_{initial}$") of 2 µF, net driver 503 has an initial pin capacitance of 4 µF, and each of the net drivers 501, 503, and 505 have a target transition time of 100 µsecs. Further, as shown, the each of the net drivers 501, 503, and 505 has a wire capacitance of 20 µF and a determined transition time of 80 µsecs.

In evaluating the net drivers 501, 503, and 505 for resizing, the computing device calculates a respective capacitance increase margin for each of the net drivers 501, 503, and 505. As part of calculating the capacitance increase margins, the computing device calculates the fanout capacitance for the net drivers 501, 503, and 505 as follows:

$$\text{fanoutCap}_{Net} = 2+4+2 = 8$$

The computing device further calculates a total capacitance of for the net drivers 501, 503, and 505 as follows:

$$\text{totalCap}_{Net} = 8+20 = 28$$

Assuming a relax factor of 1, the computing device calculates the capacitance increase margin for net driver 501 as follows.

$$\text{Margin}_{501} = 28 \times \left(1 - \frac{80}{100}\right) \times \frac{2}{8} \times 1 = 1.4$$

Thus, the maximum pin capacitance of a replacement driver cell to resize the net driver 501 is 3.4 (pinCap$_{initial}$+Margin=2+1.4). Hence, the current cell, c1, is the only allowable cell for the net driver 501.

Assuming a relax factor of 1, the computing device calculates the capacitance increase margin for net driver 503 as follows:

$$\text{Margin}_{503} = 28 \times \left(1 - \frac{80}{100}\right) \times \frac{4}{8} \times 1 = 2.8$$

Thus, the maximum pin capacitance of a replacement driver cell to resize the net driver 503 is 6.8 (pinCap$_{initial}$+Margin=4+2.8). Hence, the computing device identifies c1, c2, and c3 as allowable driver cells for the net driver 503.

Assuming a relax factor of 1, the computing device calculates the capacitance increase margin for net driver 505 as follows.

$$\text{Margin}_{505} = 28 \times \left(1 - \frac{80}{100}\right) \times \frac{2}{8} \times 1 = 1.4$$

Thus, the maximum pin capacitance of a replacement driver cell to resize the net driver 505 is 3.4 (pinCap$_{initial}$+Margin=2+1.4). Hence, the current cell, c1, is the only allowable cell for the net driver 505.

The computing device evaluates each of the drivers for resizing based on the capacitance increase margins calculated for each and in doing so, the computing device can identify one or more candidate driver cells for resizing an initial driver cell. Given that c1 is the only allowable cell form net drivers 501 and 505, there are no candidate cells identified for resizing net drivers 501 and 505. Based on the maximum pin capacitance determined for the net driver 503, the computing device identifies c1 and c3 as candidates for resizing the net driver 503.

FIG. 5B illustrates a result of the evaluation of net drivers 501, 503, and 505 and subsequent resizing. In particular, the initial cell used for the net driver 503, c2, has been replaced with an alternative cell, c3, selected from the candidate driver cells discussed above. The alternative cell has a pin capacitance of 6 µF, which is below the maximum pin capacitance determined for net driver 503. Further, the original cell, c1, is a first size and the alternative cell, c3, is a second size, which in this example is larger than the first size. Further, as shown, by resizing the net driver 503 from cell c2 to c3, the transition time for the nets 500, 502, and 504 are improved to 90 µsecs, which is within the target transition time for each.

Figure 6:
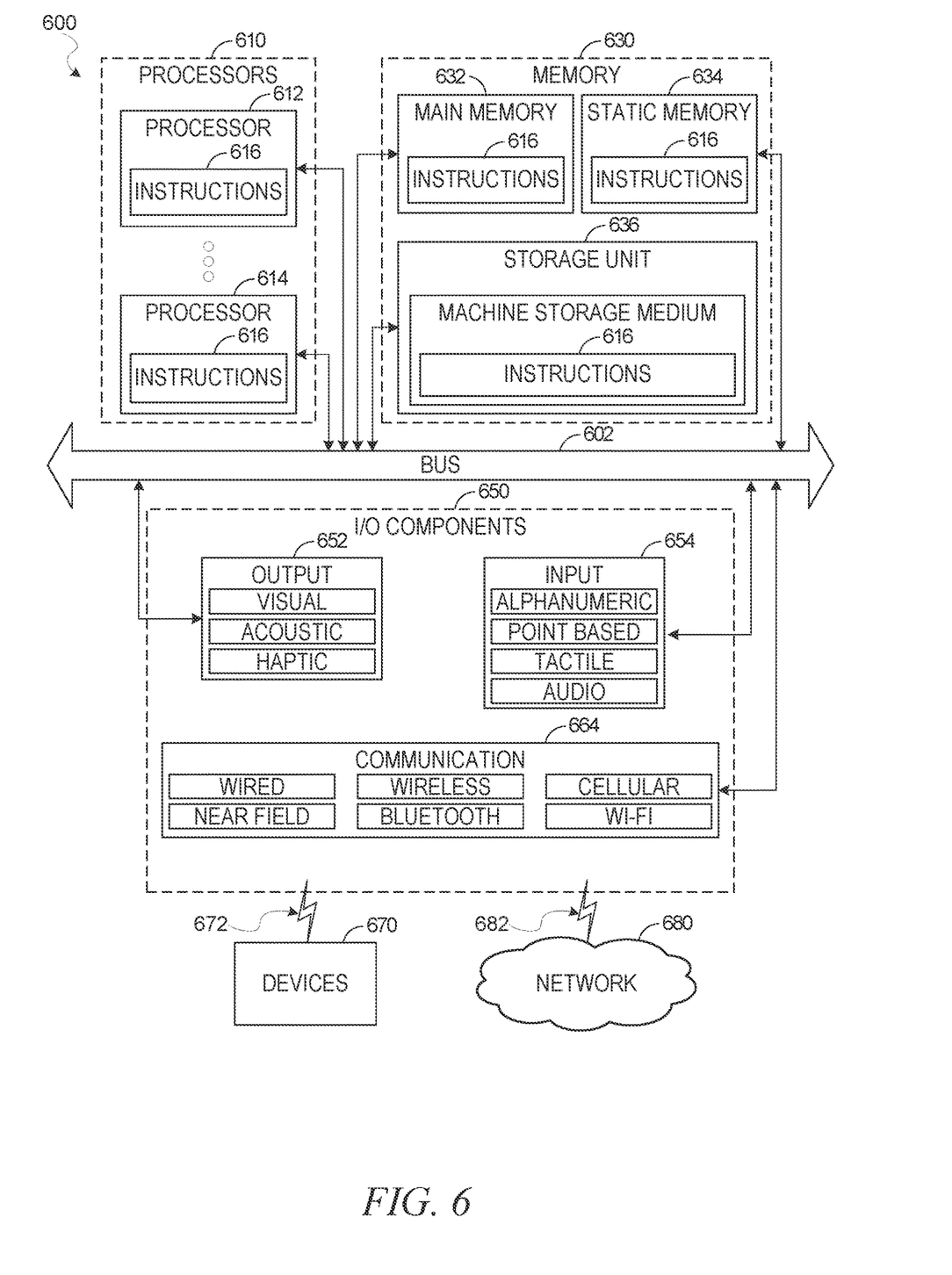
FIG. 6 is a diagrammatic representation of a machine in the example form of a computer system within which a set of instructions for causing the machine to perform any one or more of the methodologies discussed herein may be stored and executed.

FIG. 6 illustrates a diagrammatic representation of a machine 600 in the form of a computer system within which a set of instructions may be executed for causing the machine 600 to perform any one or more of the methodologies discussed herein, according to an example embodiment. Specifically, FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein may be executed. For example, the instructions 616 may cause the machine 600 to execute an EDA software system that executes the method 200. Additionally, or alternatively, the instructions 616 may implement FIGS. 1 and 5A-5B. The instructions 616 transform the general, non-programmed machine 600 into a particular machine 600 programmed to carry out the described and illustrated functions in the manner described here. In alternative embodiments, the machine 600 operates as a standalone device or may be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 616, sequentially or otherwise, that specify actions to be taken by the machine 600. Further, while only a single machine 600 is illustrated, the term "machine" shall also be taken to include a collection of machines 600 that individually or jointly execute the instructions 616 to perform any one or more of the methodologies discussed herein.

The machine 600 may include processors 610, memory 630, and I/O components 650, which may be configured to communicate with each other such as via a bus 602. In an example embodiment, the processors 610 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 612 and a processor 614 that may execute the instructions 616. The term "processor" is intended to include multi-core processors 610 that may comprise two or more independent processors (sometimes referred to as "cores") that may execute instructions 616 contemporaneously. Although FIG. 6 shows multiple processors 610, the machine 600 may include a single processor with a single core, a single processor with multiple cores (e.g., a multi-core processor), multiple processors with a single core, multiple processors with multiple cores, or any combination thereof.

The memory 630 may include a main memory 632, a static memory 634, and a storage unit 636, each accessible to the processors 610 such as via the bus 602. The main memory 632, the static memory 634, and the storage unit 636 store the instructions 616 embodying any one or more of the methodologies or functions described herein. The instructions 616 may also reside, completely or partially, within the main memory 632, within the static memory 634, within the storage unit 636, within at least one of the processors 610 (e.g., within the processor's cache memory), or any suitable combination thereof, during execution thereof by the machine 600.

The I/O components 650 may include a wide variety of components to receive input, provide output, produce output, transmit information, exchange information, capture measurements, and so on. The specific I/O components 650 that are included in a particular machine will depend on the type of machine. For example, portable machines such as mobile phones will likely include a touch input device or other such input mechanisms, while a headless server machine will likely not include such a touch input device. It will be appreciated that the I/O components 650 may include many other components that are not shown in FIG. 6. The I/O components 650 are grouped according to functionality merely for simplifying the following discussion, and the grouping is in no way limiting. In various example embodiments, the I/O components 650 may include output components 652 and input components 654. The output components 652 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components, and so forth. The input components 654 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 650 may include communication components 664 operable to couple the machine 600 to a network 680 or devices 670 via a coupling 682 and a coupling 672, respectively. For example, the communication components 664 may include a network interface component or another suitable device to interface with the network 680. In further examples, the communication components 664 may include wired communication components, wireless communication components, cellular communication components, and other communication components (NFC, Bluetooth, and Wi-Fi) to provide communication via other modalities. The devices 670 may be another machine or any of a wide variety of peripheral devices (e.g., a peripheral device coupled via a universal serial bus (USB)).

Executable Instructions and Machine-Storage Medium

The various memories (e.g., 630, 632, 634, and/or memory of the processor(s) 610) and/or the storage unit 636 may store one or more sets of instructions and data structures (e.g., software) embodying or utilized by any one or more of the methodologies or functions described herein. These instructions (e.g., the instructions 616), when executed by the processor(s) 610, cause various operations to implement the disclosed embodiments.

The terms "machine-storage medium," "device-storage medium," and "computer storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "transmission medium" discussed below.

Transmission Medium

In various example embodiments, one or more portions of the network 680 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 680 or a portion of the network 680 may include a wireless or cellular network, and the coupling 682 may be a Code Division Multiple Access (CDMA) connection, a Global System for Mobile communications (GSM) connection, or another type of cellular or wireless coupling. In this example, the coupling 682 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 616 may be transmitted or received over the network 680 using a transmission medium via a network interface device (e.g., a network interface component included in the communication components 664) and utilizing any one of a number of well-known transfer protocols (e.g., hypertext transfer protocol (HTTP)). Similarly, the instructions 616 may be transmitted or received using a transmission medium via the coupling 672 (e.g., a peer-to-peer coupling) to the devices 670. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 616 for execution by the machine 600, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
   one or more hardware processors; and
   at least one computer storage medium storing instructions, which, when executed by the one or more hardware processors, cause the one or more hardware processors to perform operations comprising:
   accessing an integrated circuit design stored in a database in memory, the integrated circuit design comprising a net comprising a set of driver cells;
   performing, by multiple processing threads, resizing of multiple driver cells in parallel, the performing of the resizing of the multiple driver cells comprising:
      determining a capacitance increase margin for resizing a driver cell in the net based on a total capacitance of the net and a transition time target of the driver cell;
      selecting, from a cell library, an alternative driver cell for resizing the driver cell such that a pin capacitance of the alternative driver cell exceeds an initial pin capacitance corresponding to the driver cell by no more than the capacitance increase margin;
      replacing the driver cell with the alternative driver cell in the net;
   storing an update to the integrated circuit design in the database in memory based on the alternative driver cell.

2. The system of claim 1, wherein the operations further comprise:
   identifying a set of candidate driver cells to replace the driver cell based on the capacitance increase margin, wherein the alternative driver cell is selected from the set of candidate driver cells.

3. The system of claim 1, wherein determining the capacitance increase margin for resizing the driver cell comprises:

determining a capacitance increase threshold based on a total capacitance of the net and a transition target for the driver cell;
determining a ratio of a pin capacitance of the driver cell to a fanout capacitance of the net; and
computing the capacitance increase margin based on a product of the capacitance increase threshold and the ratio.

4. The system of claim 3, wherein the computing the capacitance increase margin further comprises applying a configurable relaxation factor to the product of the capacitance increase threshold and the ratio.

5. The system of claim 3, wherein the operations further comprise:
determining the fanout capacitance of the net based on a sum of pin capacitances in the net; and
determining the total capacitance of the net based on a sum of the fanout capacitance of the net and a wire capacitance of the net.

6. The system of claim 3, wherein determining the capacitance increase threshold comprises:
calculating a portion of the total capacitance of the net based on a ratio of a transition time of the driver cell to the transition target for the driver cell.

7. The system of claim 1, wherein:
the driver cell is a first size; and
the alternative driver cell is a second size.

8. A method comprising:
accessing an integrated circuit design stored in a database in memory of a hardware device, the integrated circuit design comprising a net comprising a set of driver cells;
performing, by multiple processing threads, resizing of multiple driver cells in parallel, the performing of the resizing of the multiple driver cells comprising:
determining a capacitance increase margin for resizing a driver cell in the net based on a total capacitance of the net and a transition time target of the driver cell;
selecting, from a cell library, an alternative driver cell for resizing the driver cell such that a pin capacitance of the alternative driver cell exceeds an initial pin capacitance corresponding to the driver cell by no more than the capacitance increase margin;
resizing the driver cell using the alternative driver cell, the resizing including replacing the driver cell with the alternative driver cell;
storing an update to the integrated circuit design in the database in memory based on the alternative driver; and
generating, by one or more hardware processors, a layout instance for the integrated circuit design based on the alternative driver, the layout instance describing physical layout dimensions of the integrated circuit design.

9. The method of claim 8, further comprising:
identifying a set of candidate driver cells to replace the driver cell based on the capacitance increase margin, wherein the alternative driver cell is selected from the set of candidate driver cells.

10. The method of claim 8, wherein determining the capacitance increase margin for resizing the driver cell comprises:
determining a capacitance increase threshold based on a total capacitance of the net and a transition target for the driver cell;
determining a ratio of a pin capacitance of the driver cell to a fanout capacitance of the net; and
computing the capacitance increase margin based on a product of the capacitance increase threshold and the ratio.

11. The method of claim 10, further comprising:
computing the capacitance increase margin further comprises applying a configurable relaxation factor to the product of the capacitance increase threshold and the ratio.

12. The method of claim 10, further comprising:
determining the fanout capacitance of the net based on a sum of pin capacitances in the net; and
determining the total capacitance of the net based on a sum of the fanout capacitance of the net and a wire capacitance of the net.

13. The method of claim 8, further comprising:
calculating a portion of the total capacitance of the net based on a ratio of a transition time of the driver cell to the transition target for the driver cell.

14. The method of claim 8, wherein:
the driver cell is a first size; and
the alternative driver cell is a second size.

15. A computer storage medium storing instructions, which when executed by a machine, cause the machine to perform operations comprising:
accessing an integrated circuit design stored in a database in memory, the integrated circuit design comprising a net comprising a set of driver cells;
performing, by multiple processing threads, resizing of multiple driver cells in parallel, the performing of the resizing of the multiple driver cells comprising:
determining a capacitance increase margin for resizing a driver cell in the net based on a total capacitance of the net and a transition time target of the driver cell;
identifying, from a cell library, a set of candidate driver cells to replace the driver cell based on the capacitance increase margin;
selecting, from the set of candidate driver cells, an alternative driver cell for resizing the driver cell such that a pin capacitance of the alternative driver cell exceeds an initial pin capacitance corresponding to the driver cell by no more than the capacitance increase margin;
resizing the driver cell using the alternative driver cell;
storing an update to the integrated circuit design in the database in memory based on the alternative driver.

16. The computer storage medium of claim 15, wherein determining the capacitance increase margin for resizing the driver cell comprises:
determining a capacitance increase threshold based on a total capacitance of the net and a transition target for the driver cell;
determining a ratio of a pin capacitance of the driver cell to a fanout capacitance of the net; and
computing the capacitance increase margin based on a product of the capacitance increase threshold and the ratio.

17. The computer storage medium of claim 16, wherein the operations further comprise:
computing the capacitance increase margin further comprises applying a configurable relaxation factor to the product of the capacitance increase threshold and the ratio.

18. The computer storage medium of claim 17, wherein the operations further comprise:
determining the fanout capacitance of the net based on a sum of pin capacitances in the net; and
determining the total capacitance of the net based on a sum of the fanout capacitance of the net and a wire capacitance of the net.

19. The computer storage medium of claim 15, wherein the operations further comprise:
   calculating a portion of the total capacitance of the net based on a ratio of a transition time of the driver cell to the transition target for the driver cell.

* * * * *